United States Patent
Zhu et al.

(10) Patent No.: US 12,308,618 B2
(45) Date of Patent: May 20, 2025

(54) MATRIX ADDRESSABLE VERTICAL CAVITY SURFACE EMITTING LASER ARRAY

(71) Applicant: Lumentum Operations LLC, San Jose, CA (US)

(72) Inventors: Yeyu Zhu, San Jose, CA (US); Eric R. Hegblom, Sunnyvale, CA (US); Yuefa Li, San Jose, CA (US)

(73) Assignee: Lumentum Operations LLC, San Jose, CA (US)

( * ) Notice: Subject to any disclaimer, the term of this patent is extended or adjusted under 35 U.S.C. 154(b) by 770 days.

(21) Appl. No.: 17/538,592

(22) Filed: Nov. 30, 2021

(65) Prior Publication Data

US 2022/0344909 A1 Oct. 27, 2022

Related U.S. Application Data

(60) Provisional application No. 63/201,360, filed on Apr. 26, 2021.

(51) Int. Cl.
*H01S 5/42* (2006.01)
*H01S 5/042* (2006.01)
*H01S 5/183* (2006.01)

(52) U.S. Cl.
CPC .......... *H01S 5/423* (2013.01); *H01S 5/04254* (2019.08); *H01S 5/18344* (2013.01);
(Continued)

(58) Field of Classification Search
CPC ............... H01S 5/423; H01S 5/42–426; H01S 5/04254; H01S 5/04256–04257;
(Continued)

(56) References Cited

U.S. PATENT DOCUMENTS 5,031,187 A * 7/1991 Orenstein .......... H01S 5/18308
372/44.011
5,283,447 A * 2/1994 Olbright ............... H01L 31/153
257/85
(Continued)

FOREIGN PATENT DOCUMENTS

CN 1930696 A * 3/2007 ............. H01L 33/62
DE 102013211223 A1 * 12/2014 ............... F21K 9/90
(Continued)

OTHER PUBLICATIONS

Co-pending U.S. Appl. No. 17/135,511, entitled "Vertical-Cavity Surface-Emitting Laser Array With Isolatedcathodes and a Common Anode," by Guowei Zhao et al., filed Dec. 28, 2020, 36 pages.
(Continued)

*Primary Examiner* — Joshua King
(74) *Attorney, Agent, or Firm* — Harrity & Harrity, LLP

(57) ABSTRACT

In some implementations, a vertical cavity surface emitting laser (VCSEL) array may include a substrate. In some implementations, the VCSEL array may include a set of cathodes disposed on the substrate in a first direction, wherein a cathode, of the set of cathodes, is defined by a serpentine shape. In some implementations, the VCSEL array may include a set of anodes disposed on the substrate in a second direction, wherein an anode, of the set of anodes, is defined by the serpentine shape.

20 Claims, 12 Drawing Sheets

(52) U.S. Cl.
CPC ....... *H01S 5/04257* (2019.08); *H01S 5/18311* (2013.01); *H01S 5/1835* (2013.01)

(58) Field of Classification Search
CPC . H01S 5/18341; H01S 5/18311–18313; H01S 5/1835
See application file for complete search history.

(56) References Cited

U.S. PATENT DOCUMENTS

| | | | | | |
|---|---|---|---|---|---|
| 5,317,584 | A | * | 5/1994 | Mori | H01S 5/18308 372/50.124 |
| 5,453,405 | A | * | 9/1995 | Fan | H01L 21/8221 348/E5.143 |
| 5,513,202 | A | * | 4/1996 | Kobayashi | H01S 5/18305 372/45.01 |
| 5,729,566 | A | * | 3/1998 | Jewell | H01S 5/18341 257/97 |
| 5,796,714 | A | * | 8/1998 | Chino | H01S 5/18305 372/96 |
| 5,893,721 | A | * | 4/1999 | Huang | H10K 59/131 438/34 |
| 5,903,588 | A | * | 5/1999 | Guenter | H01S 5/1833 372/96 |
| 5,907,572 | A | * | 5/1999 | Yamamoto | H01L 27/156 372/50.1 |
| 5,978,403 | A | * | 11/1999 | Iwasa | G02F 1/134336 372/109 |
| 5,978,408 | A | * | 11/1999 | Thornton | H01S 5/18338 372/98 |
| 6,222,868 | B1 | * | 4/2001 | Ouchi | H01L 27/156 372/50.1 |
| 6,259,715 | B1 | * | 7/2001 | Nakayama | H01S 5/423 372/50.1 |
| 6,261,859 | B1 | * | 7/2001 | Ouchi | H01L 33/0093 438/42 |
| 6,262,540 | B1 | * | 7/2001 | Seko | H01L 27/156 345/55 |
| 6,304,588 | B1 | * | 10/2001 | Chua | H01S 5/18355 372/96 |
| 6,372,533 | B2 | * | 4/2002 | Jayaraman | H01S 5/18338 438/22 |
| 6,687,280 | B1 | * | 2/2004 | Kajita | H01S 5/4056 372/75 |
| 7,433,381 | B2 | * | 10/2008 | Wang | H01S 5/18313 372/98 |
| 7,486,713 | B2 | * | 2/2009 | Kaneko | H01S 5/18338 372/46.01 |
| 8,666,471 | B2 | * | 3/2014 | Rogers | A61B 5/6867 607/116 |
| 9,742,153 | B1 | * | 8/2017 | Barve | H01S 5/18311 |
| 9,929,536 | B1 | * | 3/2018 | Lin | H01S 5/18344 |
| 10,116,115 | B2 | * | 10/2018 | Taylor | H01L 29/1066 |
| 10,270,221 | B1 | * | 4/2019 | Wang | H01S 5/183 |
| 11,063,407 | B1 | * | 7/2021 | Ginzburg | H01S 5/0624 |
| 2002/0094598 | A1 | * | 7/2002 | Kobayashi | G02F 1/025 438/57 |
| 2002/0137245 | A1 | * | 9/2002 | Kitamura | H01S 5/04257 438/22 |
| 2003/0006416 | A1 | * | 1/2003 | Dudoff | H01L 25/167 257/E25.032 |
| 2004/0101009 | A1 | * | 5/2004 | Johnson | H01S 5/04254 372/46.013 |
| 2004/0174118 | A1 | * | 9/2004 | Yukimoto | B41J 2/45 313/512 |
| 2005/0019973 | A1 | * | 1/2005 | Chua | H01S 5/423 438/42 |
| 2005/0286595 | A1 | * | 12/2005 | Guenter | H01S 5/0264 372/50.1 |
| 2007/0241354 | A1 | * | 10/2007 | Tanaka | H01S 5/04257 257/E33.001 |
| 2008/0031295 | A1 | * | 2/2008 | Tanaka | H01L 33/0093 438/46 |
| 2008/0043793 | A1 | * | 2/2008 | Ueki | H01S 5/18311 372/38.05 |
| 2009/0129417 | A1 | * | 5/2009 | Maeda | H01S 5/18355 438/46 |
| 2009/0129419 | A1 | * | 5/2009 | Matsushita | H01S 5/04257 372/45.01 |
| 2011/0079798 | A1 | * | 4/2011 | Ogihara | H01L 33/08 257/E33.044 |
| 2011/0193114 | A1 | * | 8/2011 | Lerman | F21K 9/20 257/91 |
| 2011/0261139 | A1 | * | 10/2011 | Hoshi | G02B 26/127 347/256 |
| 2011/0274130 | A1 | * | 11/2011 | Abeles | H01S 5/04257 372/45.01 |
| 2012/0086765 | A1 | * | 4/2012 | Higashi | H01S 5/18313 372/50.12 |
| 2013/0022063 | A1 | * | 1/2013 | Kumei | H01S 5/18355 372/24 |
| 2013/0343418 | A1 | * | 12/2013 | Gerlach | H01S 5/18341 372/45.01 |
| 2014/0152393 | A1 | * | 6/2014 | Motomura | H01S 5/423 372/44.011 |
| 2015/0139260 | A1 | * | 5/2015 | Gerlach | H01S 5/187 372/50.11 |
| 2015/0222094 | A1 | * | 8/2015 | Lee | H01S 5/18313 372/50.12 |
| 2016/0072258 | A1 | * | 3/2016 | Seurin | G06V 20/698 362/11 |
| 2016/0105950 | A1 | * | 4/2016 | Drzaic | H05K 3/0014 156/196 |
| 2016/0141839 | A1 | * | 5/2016 | Matsubara | H01S 5/423 372/38.05 |
| 2017/0040306 | A1 | * | 2/2017 | Kim | H05K 1/181 |
| 2017/0070027 | A1 | * | 3/2017 | Kondo | H01S 5/423 |
| 2017/0244219 | A1 | * | 8/2017 | Barve | H01S 5/423 |
| 2017/0353012 | A1 | * | 12/2017 | Barve | H01S 5/423 |
| 2017/0365984 | A1 | * | 12/2017 | Lipson | H01S 5/0237 |
| 2018/0269655 | A1 | * | 9/2018 | Koyama | H01S 5/18377 |
| 2018/0301875 | A1 | * | 10/2018 | Burroughs | H01S 5/0071 |
| 2018/0356459 | A1 | * | 12/2018 | Kubota | H01S 5/0021 |
| 2019/0052059 | A1 | * | 2/2019 | Kubota | H01S 5/04254 |
| 2019/0052365 | A1 | * | 2/2019 | Joseph | H04B 10/50 |
| 2019/0089127 | A1 | * | 3/2019 | Gazula | H01S 5/18311 |
| 2019/0181619 | A1 | * | 6/2019 | Yuen | H01S 5/18308 |
| 2019/0279558 | A1 | * | 9/2019 | Monestier | G09G 3/32 |
| 2019/0305522 | A1 | * | 10/2019 | Yuen | H01S 5/04254 |
| 2019/0363520 | A1 | * | 11/2019 | Laflaquiere | H01S 5/18305 |
| 2020/0076161 | A1 | * | 3/2020 | Fujii | H01S 5/18358 |
| 2020/0083669 | A1 | * | 3/2020 | Na | G01P 13/00 |
| 2020/0119527 | A1 | | 4/2020 | Hegblom | |
| 2020/0203927 | A1 | * | 6/2020 | Lee | H01S 5/2205 |
| 2020/0278426 | A1 | * | 9/2020 | Dummer | H01S 5/18305 |
| 2020/0280175 | A1 | * | 9/2020 | Lee | H01S 5/423 |
| 2020/0321754 | A1 | | 10/2020 | Hegblom et al. | |
| 2021/0305782 | A1 | * | 9/2021 | Roucka | H01S 5/04256 |

FOREIGN PATENT DOCUMENTS

| | | | | |
|---|---|---|---|---|
| EP | 0007384 | A1 | * | 2/1980 |
| EP | 0499659 | A1 | * | 8/1992 |
| JP | H0964462 | A | * | 3/1997 |
| JP | H10189919 | A | * | 7/1998 |
| KR | 20190115406 | A | * | 10/2019 |
| TW | 531849 | B | * | 5/2003 |
| WO | WO-2008124380 | A2 | * | 10/2008 ......... G11C 11/4097 |
| WO | WO-2011111399 | A1 | * | 9/2011 ............... F21K 9/23 |
| WO | WO-2018187376 | A1 | * | 10/2018 ............ A61B 5/0002 |
| WO | WO-2019146634 | A1 | * | 8/2019 ............... G09G 3/32 |
| WO | WO-2020061749 | A1 | * | 4/2020 ........... H01S 5/0225 |
| WO | WO-2020061752 | A1 | * | 4/2020 ......... H01S 5/02251 |
| WO | WO-2020214503 | A1 | * | 10/2020 ......... G01B 11/2513 |

OTHER PUBLICATIONS

Morgan, R.A. et al., "Two-Dimensional Matrix Addressed Vertical Cavity Top-Surface Emitting Laser Array Display," IEEE Photonics

(56) References Cited

OTHER PUBLICATIONS

Technology Leters, vol. 6, No. 8, Aug. 1994, 5 pages.
Geib, Kent M. et al., "Fabrication and Performance of Two-Dimensional Matrix Addressable Arrays of Integrated Vertical-Cavity Lasers and Resonant Cavity Photodetectors," IEEE Journal of Selected Topics in Quantum Electronics, vol. 8, No. 4, Jul./Aug. 2002, 5 pages.

\* cited by examiner

MATRIX ADDRESSABLE VERTICAL CAVITY SURFACE EMITTING LASER ARRAY

CROSS-REFERENCE TO RELATED APPLICATION

This Patent Application claims priority to U.S. Provisional Patent Application No. 63/201,360, filed on Apr. 26, 2021, and entitled "MATRIX ADDRESSABLE VERTICAL CAVITY SURFACE EMITTING LASER ARRAYS." The disclosure of the prior Application is considered part of and is incorporated by reference into this Patent Application.

TECHNICAL FIELD

The present disclosure relates generally to lasers and to a matrix addressable design for a vertical cavity surface emitting laser (VCSEL) array.

BACKGROUND

A vertical-emitting device, such as a bottom-emitting or top-emitting vertical-cavity surface-emitting laser (VCSEL), is a laser in which a laser beam is emitted in a direction perpendicular to a surface of a substrate (e.g., vertically from a surface of a semiconductor wafer). A typical VCSEL includes epitaxial layers (epi layers) grown on a substrate. The epitaxial layers may include, for example, a pair of reflectors (e.g., a pair of distributed Bragg reflectors (DBRs)), an active region, an oxidation layer, and/or the like. Other layers may be formed on or above the epitaxial layers, such as one or more dielectric layers, metal layers, and/or the like. A VCSEL array may provide multiple emitting sources on a single chip for emitting a single beam or multiple discrete beams.

SUMMARY

According to some implementations, a vertical cavity surface emitting laser (VCSEL) array may include a substrate; a set of cathodes disposed on the substrate in a first direction, wherein a cathode, of the set of cathodes, is defined by a serpentine shape; and a set of anodes disposed on the substrate in a second direction, wherein an anode, of the set of anodes, is defined by the serpentine shape.

According to some implementations, a VCSEL array may include a substrate; a set of cathodes disposed on the substrate in a first direction; a set of anodes disposed on the substrate in a second direction; and a set of emitters disposed on the substrate in a grid arrangement, wherein an emitter, of the set of emitters, is associated with a set of first trenches and a set of second trenches, wherein the set of first trenches comprises a set of n-epi etching trenches that etch an n-contact layer of the substrate, and wherein the set of second trenches comprises a set of small trenches that, with the set of first trenches, forms an oxidation aperture for the emitter.

According to some implementations, a VCSEL array may include a substrate; a set of cathodes disposed on the substrate in a first direction, wherein a cathode, of the set of cathodes, is defined by a serpentine shape; a set of anodes disposed on the substrate in a second direction, wherein an anode, of the set of anodes, is defined by the serpentine shape; and a set of emitters disposed on the substrate in a hexagonal grid arrangement, wherein an emitter, of the set of emitters, is associated with a set of first trenches and a set of second trenches, wherein the set of first trenches comprises a set of n-epi etching trenches that etch an n-contact layer of the substrate, and wherein the set of second trenches comprises a set of small trenches that, with the set of first trenches, forms an oxidation aperture for the emitter.

According to some implementations, a method of manufacturing a VCSEL array may include etching a set of trenches on a surface of a substrate; forming a set of anode traces and a set of cathode traces on the surface of the substrate; and forming a set of emitters on the surface of the substrate.

DETAILED DESCRIPTION

Figure 1A:
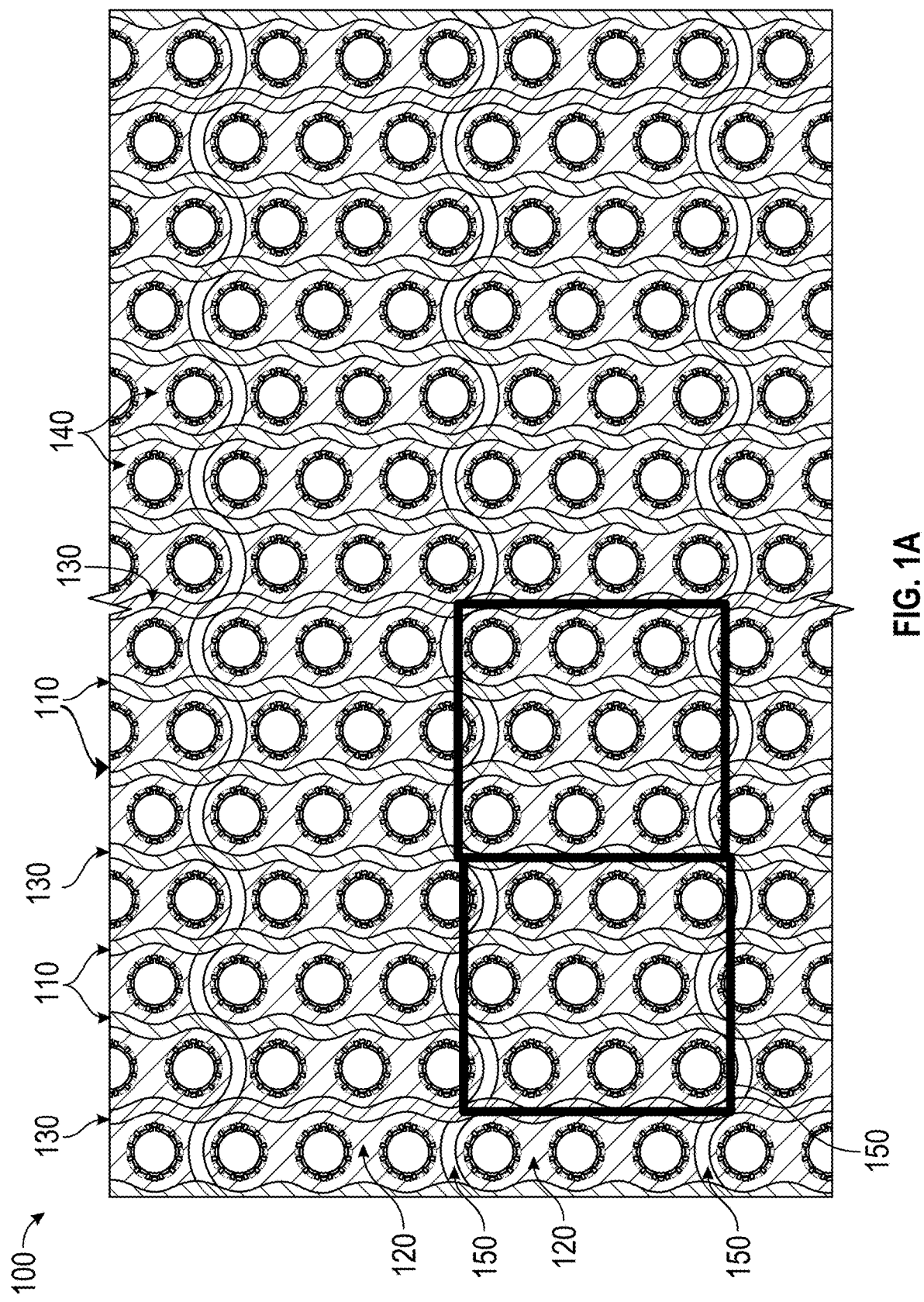
FIGS. 1A-1D are diagrams of an example matrix addressable vertical cavity surface emitting laser (VCSEL) array with serpentine anodes and cathodes, as described herein.

The following detailed description of example implementations refers to the accompanying drawings. The same reference numbers in different drawings may identify the same or similar elements.

Multiple vertical-emitting devices (e.g., vertical cavity surface emitting lasers (VCSELs)) may be arranged on a single chip to form an array. For example, multiple vertical-emitting devices (which may be referred to as "emitters") may be arranged to form an emitter array (e.g., a VCSEL array), such as a rectangular grid emitter array (e.g., where multiple emitters are uniformly spaced and oxidation trenches may be shared by two or more emitters) or a non-grid emitter array (e.g., where multiple emitters are not uniformly spaced and each emitter requires a set of oxidation trenches which may or may not be shared).

Some emitter arrays may have emitters arranged in a matrix addressable layout. For example, a two-dimensional matrix addressable VCSEL array may include a set of anode traces forming a set of straight rows and a set of cathode traces forming a set of straight columns with emitters disposed at intersections between anode traces and cathode traces. The anode traces may be referred to as "anodes" or "an anode" and the cathode traces may be referred to as "cathodes" or "a cathode". By selectively controlling current to different cathode traces and anode traces (e.g., using sets of switches), a controller may send current to selected emitters to cause the selected emitters to output one or more beams. In this case, both the set of anode traces and the set of cathode traces may be disposed on the same surface of a substrate (e.g., a top surface for a top-emitting VCSEL array). However, including both the set of anode traces and the set of cathode traces on the same surface may result in a relatively large emitter pitch or a relatively large chip. As optical systems, such as optical sensor systems (e.g., LIDAR systems) or optical communications systems, among other examples, that include lasers are increasingly miniaturized, it is advantageous to reduce an emitter pitch and a chip size.

Some implementations described herein provide for a two-dimensional matrix addressable VCSEL array that includes serpentine shaped anodes, cathodes, or isolation trenches, thereby enabling an increased emitter density and a reduced emitter pitch and chip size. By increasing emitter density, a VCSEL array enables an optical system to achieve a same resolution as other VCSEL arrays, but in a smaller package. Additionally, or alternatively, increasing emitter density enables a VCSEL array to achieve higher resolution than other VCSEL arrays in the same size package. This enables increasing miniaturization for optical systems, such as optical sensor systems (e.g., LIDAR systems or biometric measurement systems) or optical communication systems, among other examples.

Additionally, or alternatively, some implementations may include traces (e.g., cathode traces or anode traces) that span both a bottom surface of an isolation trench and one or more sidewalls of the isolation trench. By including traces on sidewalls of an isolation trench, a VCSEL array achieves an increased surface area of the traces and reduces a trace resistance associated with the traces. Reducing trace resistance enables a reduction in emitter pitch and a reduction in chip size. Additionally, or alternatively, some implementations may enable manufacture of a matrix addressable VCSEL array with multiple types of trenches and trench etch regions using a single trench etching step, thereby improving manufacturability of VCSEL arrays and reducing costs associated with manufacturing VCSEL arrays.

FIGS. 1A-1D are diagrams of a matrix addressable VCSEL array 100 with serpentine anodes and cathodes.

FIG. 1A shows an example of a layout of emitters in the matrix addressable VCSEL array 100. As shown in FIG. 1A, a set of cathode traces 110, a set of anode traces 120, and a set of isolation trenches 130 may be disposed on a substrate. The set of cathode traces 110 may be arranged to form a set of columns and the set of anode traces 120 may be arranged to form a set of rows to enable a controller to control a set of emitters 140 disposed at intersections between the set of cathode traces 110 and the set of anode traces 120. Isolation trenches 130 may electrically isolate subarrays of emitters 140 from other subarrays of emitters 140.

In some implementations, a lower distributed Bragg reflector (DBR) in epitaxial layers of VCSEL array 100 may include a highly-doped n++ contact layer for cathode traces 110 to connect to each emitter 140. Vertical isolation trenches 130 may be disposed on the substrate to prevent shorting of different cathode traces 110 of different subarrays, as described in more detail herein. A vertical isolation trench 130 may be ion implanted to provide isolation between a pair of cathode traces 110 and may be etched to an n+ contact layer or below. To prevent shorting of different anode traces 120 of different subarrays, as described in more detail herein, gaps 150 between the anode traces 120 may be implanted to isolate upper semiconductor layers above one or more active diode junctions. Alternatively, in some implementations, within the gaps 150, a trench may be etched to remove the upper semiconductor layers above the one or more active diode junctions, and the trench may be additionally implanted for further isolation. In some implementations, a cathode trace 110 or an anode trace 120 may be disposed in a trench. For example, an anode trace 120 may be disposed in a horizontal connecting trench (e.g., along a base or along a base and sidewalls of the horizontal connecting trench), as described herein.

In some implementations, the set of cathode traces 110 or the set of anode traces 120 may be associated with a particular shape. For example, as shown, a cathode trace 110 is associated with a serpentine shape in a first direction (a vertical direction) and an anode trace 120 is associated with the serpentine shape in a second direction (a horizontal direction). Similarly, as shown, an isolation trench 130 is associated with the serpentine shape in the first direction or the second direction. A serpentine shape may be a non-linear shape, such as a shape approximating a sinusoidal curve. Other shapes approximating a serpentine shape may be possible, such as a triangular shape (e.g., a shape approximating a triangular wave), a sawtooth shape (e.g., a shape approximating a sawtooth wave), a square shape (e.g., a shape approximating a square wave), a modified square shape (e.g., a square shape approximating a sinusoidal shape using a discrete set of straight forms), or a stepwise shape, among other examples. Additionally, or alternatively, a combination of multiple shapes may be possible, such as a sinusoidal shape for a first segment of a trace and a triangular shape for a second segment of a trace.

In some implementations, multiple traces may have a same shape. For example, a cathode trace 110 and an anode trace 120 may have the same serpentine shape in different directions. In some implementations, multiple traces may have different shapes. For example, a cathode trace 110 may have a first serpentine shape (e.g., defined by a first curvature, radius, or roundness, among other examples) in the first direction and an anode trace 120 may have a second serpentine shape (e.g., defined by a second curvature, radius, or roundness) in the second direction. Additionally, or alternatively, a cathode trace 110 may have a serpentine shape or a modified square shape, and an anode trace may have a linear shape. In some implementations, multiple traces may be considered to be parallel. For example, a first cathode trace 110 with a serpentine shape may be parallel or approximately parallel to a second cathode trace 110 with the same serpentine shape. Similarly, a cathode trace 110 with a serpentine shape may be parallel or approximately parallel to an isolation trench 130.

In some implementations, emitters 140 may be divided into matrix addressable subarrays. For example, the matrix addressable VCSEL array 100 may have a set of M×N subarrays (e.g., 2×2, 4×4, 8×8, 2×4, 5×3, or any other combination) and each subarray may have Y×Z emitters 140 (e.g., 2×2, 4×4, 8×8, 2×4, 5×3, or any other combination). As shown, the matrix addressable VCSEL array 100 has a subarray 150 with 3×3 emitters 140. In some implementations, subarrays of the matrix addressable VCSEL array 100 may have the same quantity of emitters, thereby providing uniformity in an output of each subarray. In some implementations, subarrays of the matrix addressable VCSEL array 100 may have different quantities of emitters, thereby enabling differentiated output from each subarray, such as to increase a beam intensity at certain portions of the beam. Each subarray may be disposed at an intersection of an n-metallization stripe (e.g., an n-metal layer) and a p-metallization stripe (e.g., a p-metal layer) with an anode trace 120 that connects the subarray over a row and a cathode trace 110 that connects the subarray over a column. In this case, when a controller applies a positive voltage to one or more cathode traces 110 and one or more anode traces 120, the controller may cause emitters 140 of one or more respective subarrays to emit one or more beams.

Figure 1B:
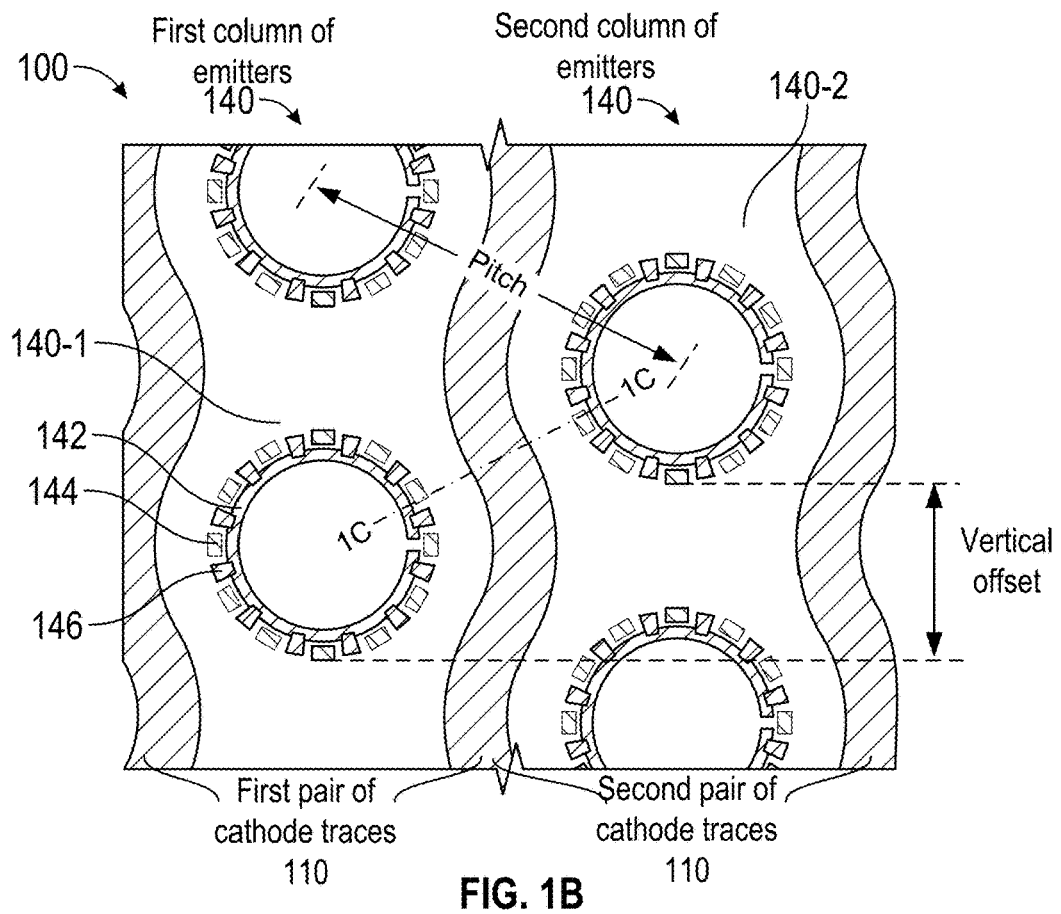

In some implementations, emitters 140 may be arranged in a grid layout. For example, emitters 140 may be arranged in a non-rectangular grid layout, such as a hexagonal close pack arrangement. In this case, as shown in FIG. 1B, emitter 140-1, which is in a first column of emitters 140 bounded by a first pair of cathode traces 110, is offset from emitter 140-2, which is in a second column of emitters 140 bounded by a second pair of cathode traces 110, in a vertical direction. In this way, emitters 140 are disposed in an arrangement approximating a two-dimensional hexagonal close packing (HCP). By disposing emitters 140 in an arrangement approximating a two-dimensional HCP arrangement, the matrix addressable VCSEL array 100 fits more emitters 140 on the same size substrate or the same quantity of emitters 140 on a smaller size substrate than is achieved using a rectangular grid layout and similarly sized emitters 140. In other words, the matrix addressable VCSEL array 100 may have an increased emitter density. For example, with an oxidation aperture (OA) of 28.0 micrometers (μm), use of a two-dimensional HCP arrangement results in a reduction in pitch between emitters 140 from 74.0 μm (with a rectangular grid layout) to 66.0 μm (with the two-dimensional HCP arrangement). Moreover, using a two-dimensional HCP arrangement may result in an increased emitter density relative to other non-rectangular emitter arrangements, such as non-uniform emitter arrangements.

As further shown in FIG. 1B, an emitter 140 (e.g., emitter 140-1) may include a p-ohmic metal (POM) region 142, a set of etch trench regions 144, and a set of via openings 146. For example, an emitter 140 may include a partially ring shaped (e.g., a ring shape with a gap in the ring shape) p-ohmic metal region 142, which includes a set of teeth (e.g., a toothed shape) along an exterior of the partial ring shape. The set of teeth, which may also be referred to as "wings" or "flanges", may form a castellated or crenellated shape along an exterior of the partial ring shape. As shown, each tooth may surround a via opening 146, which may connect the p-ohmic metal region 142 to a plating metal layer. An etch trench region 144 may form oxidation apertures and may be disposed between teeth (e.g., pairs of teeth) of p-ohmic metal region 142.

In another example, an emitter 140 may include etched pits, etched rings, etched pillars, or other shapes to form the emitter 140. Additionally, or alternatively, an emitter 140 may be a single junction emitter or may include multiple junctions, which may include one or more quantum wells or other optically active materials. An emitter 140 may include an ion implantation region or may be configured without an ion implementation region. For example, for a ring or pillar shaped emitter 140, an ion implantation region may not be included, in some implementations. Alternatively, an ion implantation region or layer may be included between an emission area of emitter 140 and a sidewall of a trench.

Figure 1C:
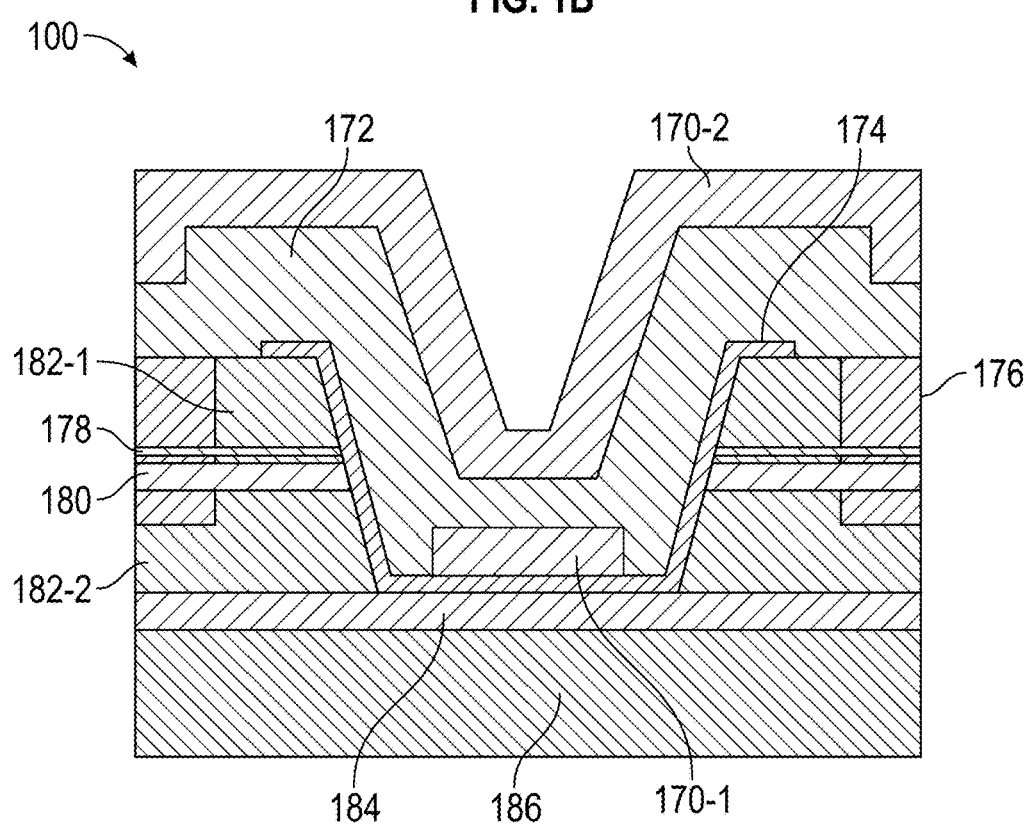
Figure 1D:
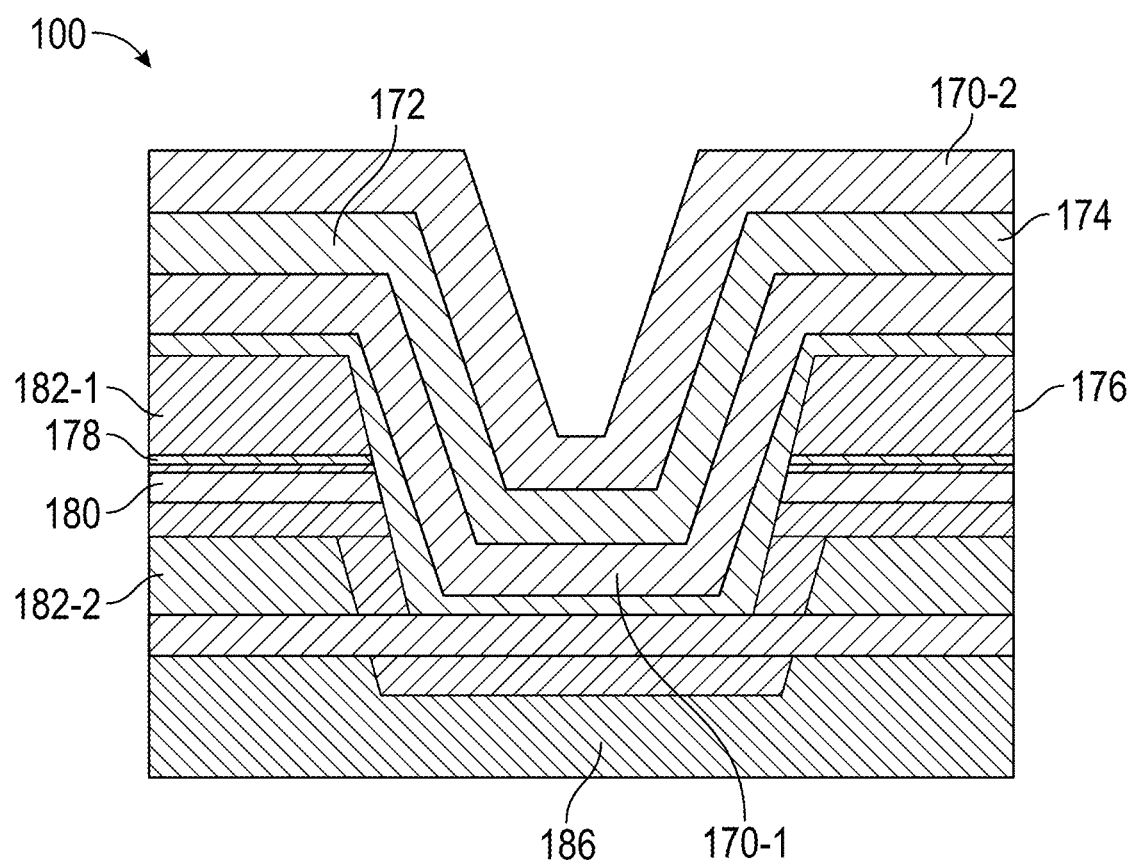

FIG. 1C and FIG. 1D show a stackup of layers of the matrix addressable VCSEL ARRAY 100. For example, FIG. 1C shows a stackup of layers of an n-epitaxial (n-epi) etching area with an n-metal stripe, and FIG. 1D shows a stackup of layers of an isolated trench area. As shown in FIG. 1C, matrix addressable VCSEL array 100 may include a pair of interconnect metal layers 170-1 (e.g., a metal plating layer with a thickness of approximately 3.0 μm) and 170-2 (e.g., a metal plating layer with a thickness of approximately 2.5 μm). A silicon nitride (SiN) layer 172 (e.g., with a thickness of approximately 500 nanometers (nm)) may be disposed between the interconnect metal layers 170-1 and 170-2. An n-metallization layer 174 may be disposed below the SiN layer 172 and the interconnect metal layer 170-1. Layers below the SiN layer 172 and the n-metallization layer 174 may include an isolation implantation layer 176, a laterally oxidized layer 178 (e.g., a high content aluminum oxidation layer), one or more active junction layers 180, upper and lower distributed Bragg reflector (DBR) layers 182-1 and 182-2, respectively, an n+(or n++) contact layer 184, and a substrate base layer 186 (e.g., an isolated gallium arsenide (GaAs) substrate or a semi-insulating GaAs substrate).

In some implementations, the n-metallization layer 174 may form an n-epitaxial (n-epi) trench with a sloped etching profile. For example, the n-metallization layer 174 may form an n-metal trace to convey current using interconnect metal layer 170-1, which is disposed on a bottom surface of the n-epi trench, along a length of a chip that includes the matrix addressable VCSEL array 100. As an example, in a matrix addressable VCSEL array 100 with five 10 μm wide and 2 μm thick gold interconnect metal layers 170-1 supplying a subarray that is 5 millimeters (mm) in length, resistance to the subarray may be approximately 1 ohm. When the subarray is powered by tens of amps of a short pulse to achieve an optical pulse for, for example, a LIDAR optical system, the subarray may use tens of volts extra to overcome the 1 ohm resistance. As described in more detail herein, extending the interconnect metal layer 170-1 along sidewalls of the n-epi trench of n-metallization layer 174 may reduce resistance, thereby reducing a consumption of voltage.

In some-implementations, an etching profile and etching target of an oxidation trench region 144 and an isolation trench 130 may be different, which may result in separate etching steps. For example, an oxidation trench region 144 may have a vertical etching profile to form an oxide aperture through lateral oxidation and an isolation trench 130 may have a sloped etching profile (e.g., which may enable n-metallization liftoff and SiN deposition). As described in more detail herein, altering the etching profiles to match may result in improved manufacturability for VCSEL arrays.

As indicated above, FIGS. 1A-ID are provided as an example. Other examples may differ from what is described with regard to FIGS. 1A-ID.

Figure 2A:
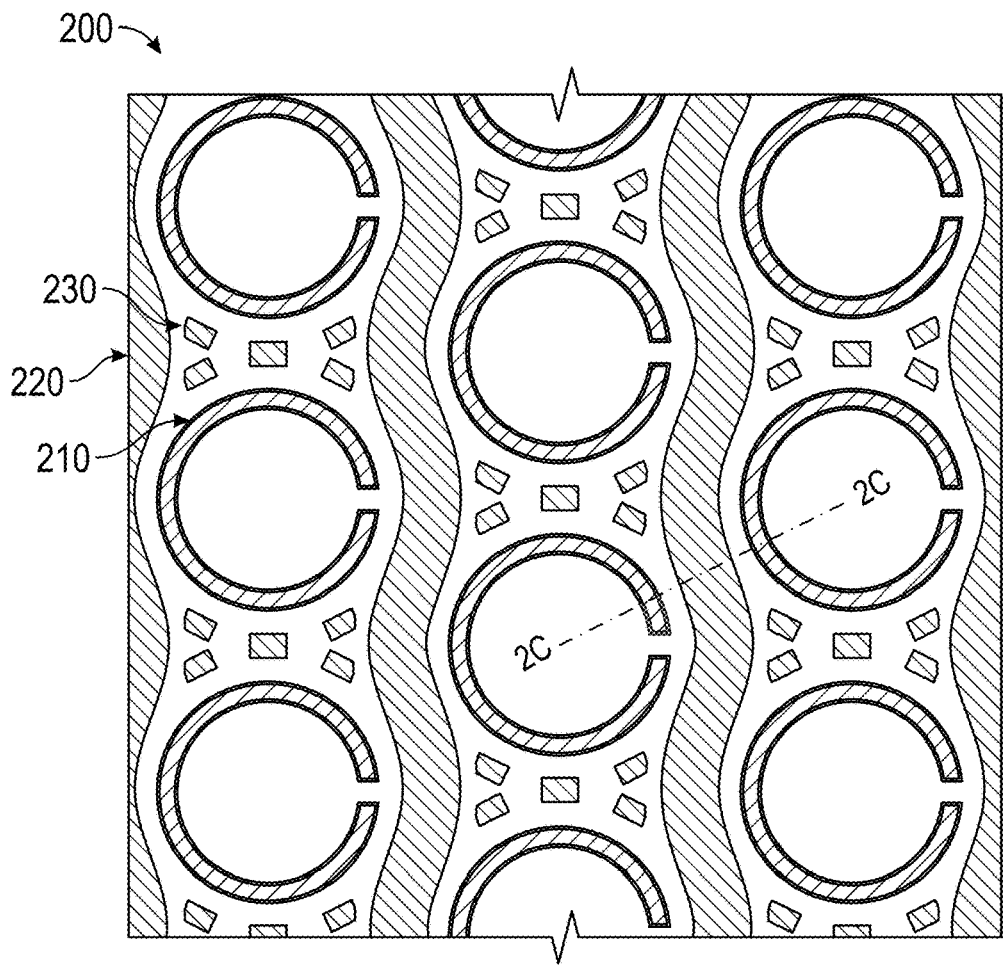
FIGS. 2A-2C are diagrams of an example matrix addressable VCSEL array with cathodes disposed along sidewalls of an isolation trench, as described herein.
Figure 2B:
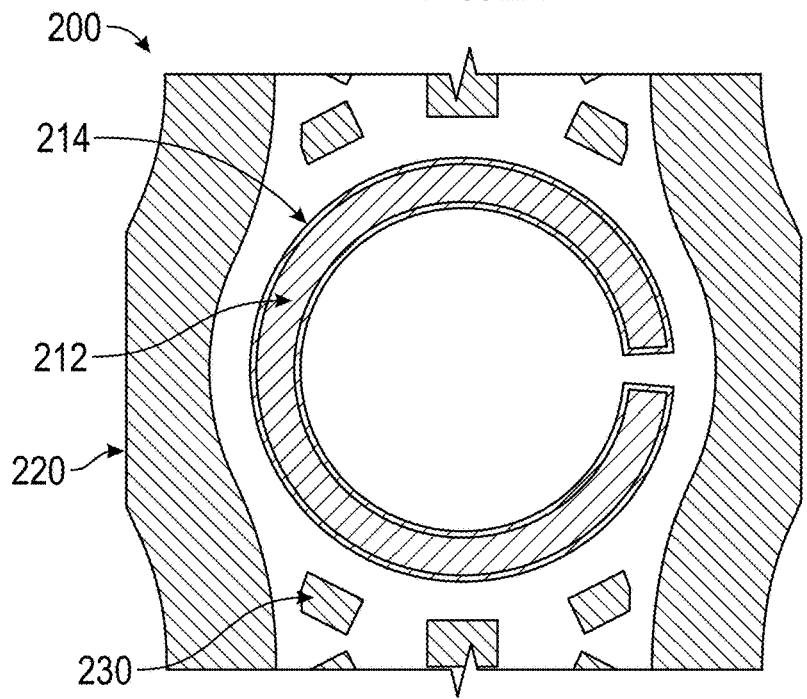
Figure 2C:
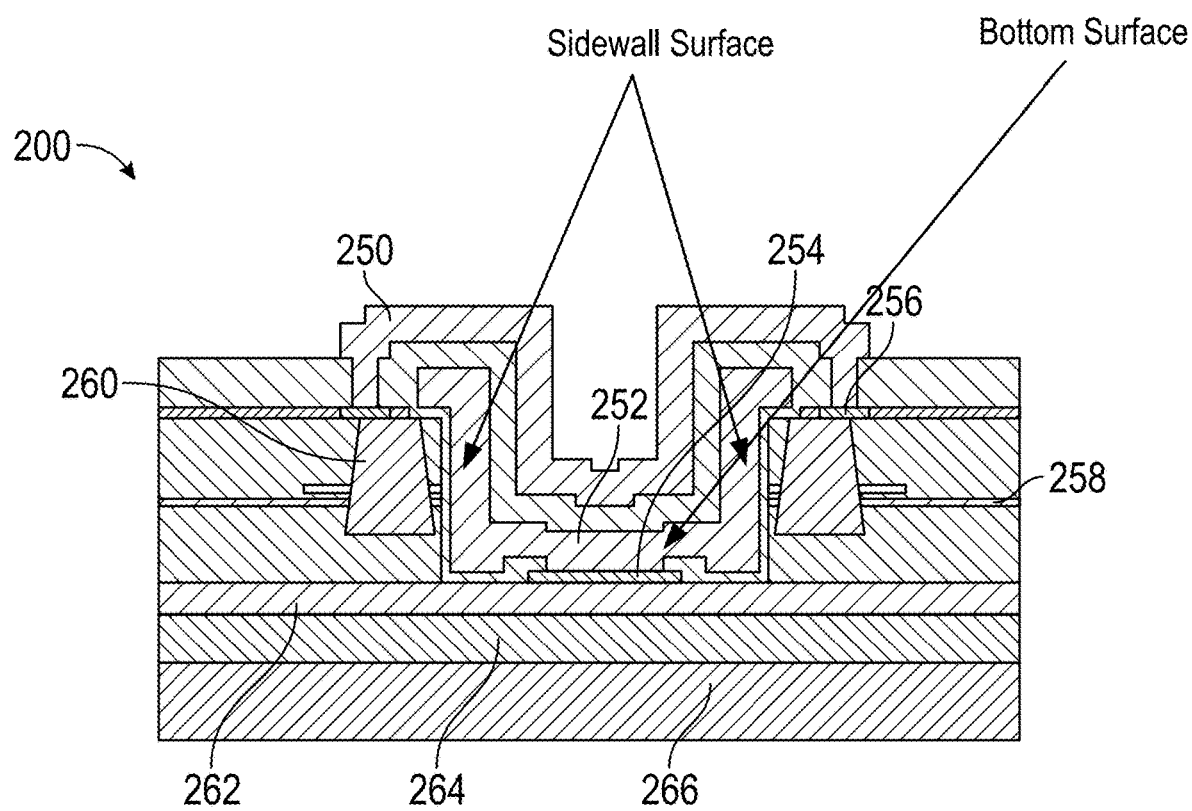

FIGS. 2A-2C are diagrams of a matrix addressable VCSEL array 200, which utilizes trenches for cathodes and cathode isolation and also to provide an opening for lateral oxidation to define an emitter shape. In this way, matrix addressable VCSEL array 200 is more compact than other VCSEL arrays, in which n-epi trenches for cathodes do not help define the oxidization aperture of an emitter. In some implementations, matrix addressable VCSEL array 200 has cathodes disposed along sidewalls of an n-epi trench.

As shown in FIGS. 2A and 2B, matrix addressable VCSEL array 200 may include an emitter 210, a first set of n-epi trenches 220 (which may be referred to as "serpentine trenches"), and a second set of oxidation trenches 230 (which may be referred to as "small trenches" or "trench segments"). N-epi trenches 220 may be etched to an n+ contact layer or deeper and may serve as either as trenches for the cathodes or as isolation trenches. As shown in FIG. 2C, in cross-section, matrix addressable VCSEL array 200 may include a p-plating metal (PPLT) layer 250, an n-plating metal (NPLT) layer 252, an n-ohmic metal (NOM) layer 254, a p-ohmic (POM) metal layer 256, an optically active layer (e.g., a single junction with multiple light-emitting quantum wells or multiple junctions) 258, an implantation layer 260, an n+ contact layer 262, a blocking layer 264 (e.g., a $(p/n)^x$, such as a p/n/p/n/p/n blocking layer), and a substrate base layer 266 (e.g., an n+ GaAs substrate).

In some implementations, a substrate base layer 266 may be a semi-insulating GaAs substrate and layer 264 is not included. As described above, n-epi trenches 220 may serve as openings for lateral oxidation to define an aperture for light-emission in connection with lateral oxidation proceeding from the oxidation trenches 230. By using the n-epi trenches for both the n-contact or cathode isolation and for lateral oxidation, the emitter pitch and the die size are reduced compared to other configurations in which serpentine trenches do not provide a source for lateral oxidation to define the emitter opening. For example, a configuration with an oxide aperture of 28 μm reduces an emitter pitch for emitters 210 from 66 μm (e.g., for emitters 140 in FIG. 1B) to 54 μm as configured in FIG. 2A. In this way, the configuration of emitters 210 enables miniaturization of matrix addressable VCSEL array 200.

In some implementations, emitter 210 may include a partially ring shaped p-ohmic region 212 and a partially ring shaped via opening 214 surrounding p-ohmic region 212. For example, emitter 210 may lack the teeth (e.g., the castellated or crenellated shape) present with emitter 140, as described above. In this case, using a partially ring shaped via opening 214 increases a via area and reduces a current density in via opening 214 relative to the multiple discrete via openings 146. The increase in via area and reduction in current density reduces resistance and enables reduced power consumption for matrix addressable VCSEL array 200 relative to other types of VCSEL arrays.

In some implementations, the first set of n-epi trenches 220 may be serpentine shaped n-epi etching trenches corresponding to isolation trenches 130 and the second set of trenches may be oxidation trench regions corresponding to oxidation trench regions 144. In this case, the first set of n-epi trenches 220 and the second set of oxidation trenches 230 may share an etching profile (e.g., trenches 220 and 230 have etching profiles in the same direction but with different etching depths). In this way, by having the same etching profile for the first set of n-epi trenches 220 and the second set of oxidation trenches 230, a single etching step may be used for manufacturing the first set of n-epi trenches 220 and the second set of oxidation trenches 230. Moreover, by enabling manufacture using a single etching step, matrix addressable VCSEL array 200 improves manufacturability and reduces cost of manufacturing a matrix addressable VCSEL array relative to other techniques. In some implementations, the first set of n-epi trenches may be etched to reach an n-contact layer and used to provide cathode traces an n-plating metal (NPLT) layer 252, an n-ohmic metal (NOM) layer and a second set of n-epi trenches may be etched (e.g., concurrently) to provide isolation between cathodes.

In some implementations, sidewalls of the first set of n-epi trenches 220 may be covered by traces (e.g., the serpentine cathode traces 110 or the serpentine anode traces 120). For example, rather than traces being confined to a bottom surface, which may also be referred to as a "floor", of an isolation trench 220, a trace may cover the bottom surface and one or both sidewall surfaces of the isolation trench 220. For example, as shown in FIG. 2C, NPLT layer 252 has a vertical etching profile covering both the sidewall surfaces and the bottom surface of an isolation trench 220. In this way, n-epi trenches 220 increase an effective width of a trace disposed thereon, thereby reducing trace resistance and enabling reductions in emitter pitch, chip size, and power consumption. The ion implantation layers enable isolation of, for example, a cathode metal on a sidewall of an n-epi trench 220 from an n-epi layer that is in contact with an anode. This may enable isolation without using thick dielectric layers, which may suffer from stress conditions or peeling, or using thin dielectric layers, which may be prone to shorting. In some implementations, the cathode metal on the sidewall may form an at least partial mask for ion implantation, thereby enabling ion implantation without difficulties in shaping a photoresist for ion implementation.

As indicated above, FIGS. 2A-2C are provided as an example. Other examples may differ from what is described with regard to FIGS. 2A-2C.

Figure 3A:
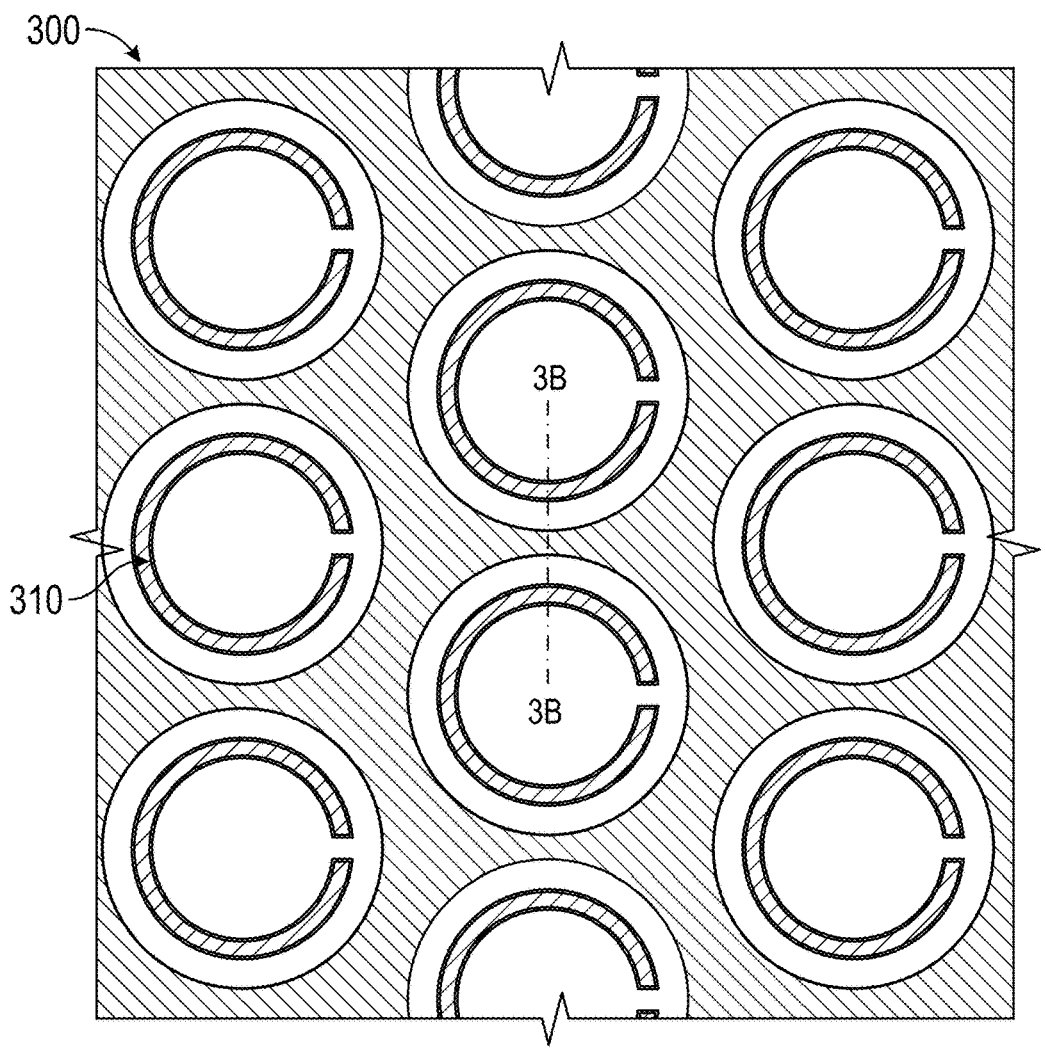
FIGS. 3A-3F are diagrams of example matrix addressable VCSEL arrays, as described herein.
Figure 3B:
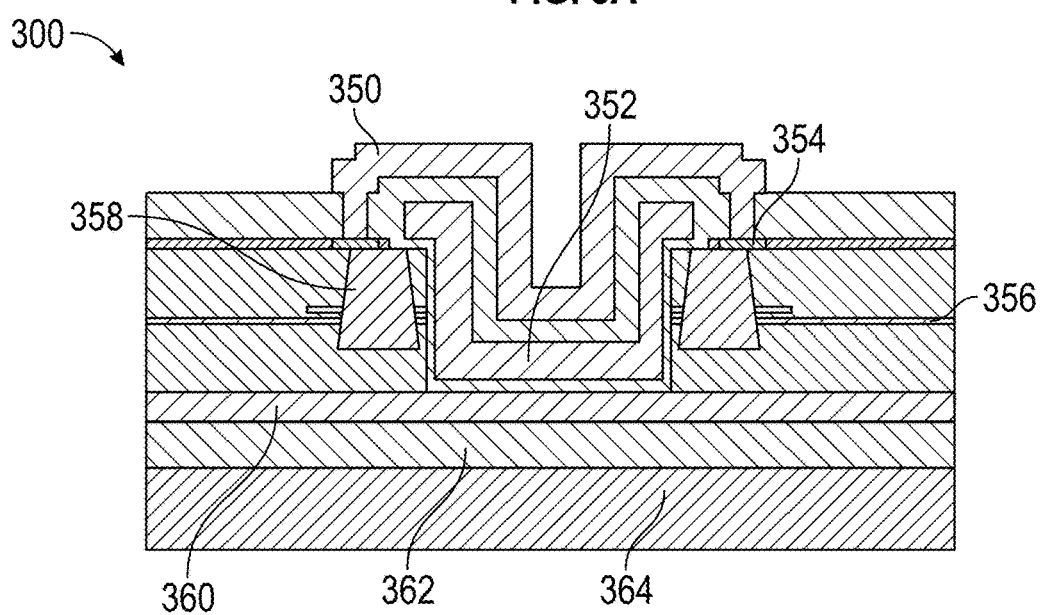

FIGS. 3A and 3B are diagrams of a matrix addressable VCSEL array 300 array with anodes disposed along sidewalls of an isolation trench.

Figure 3C:
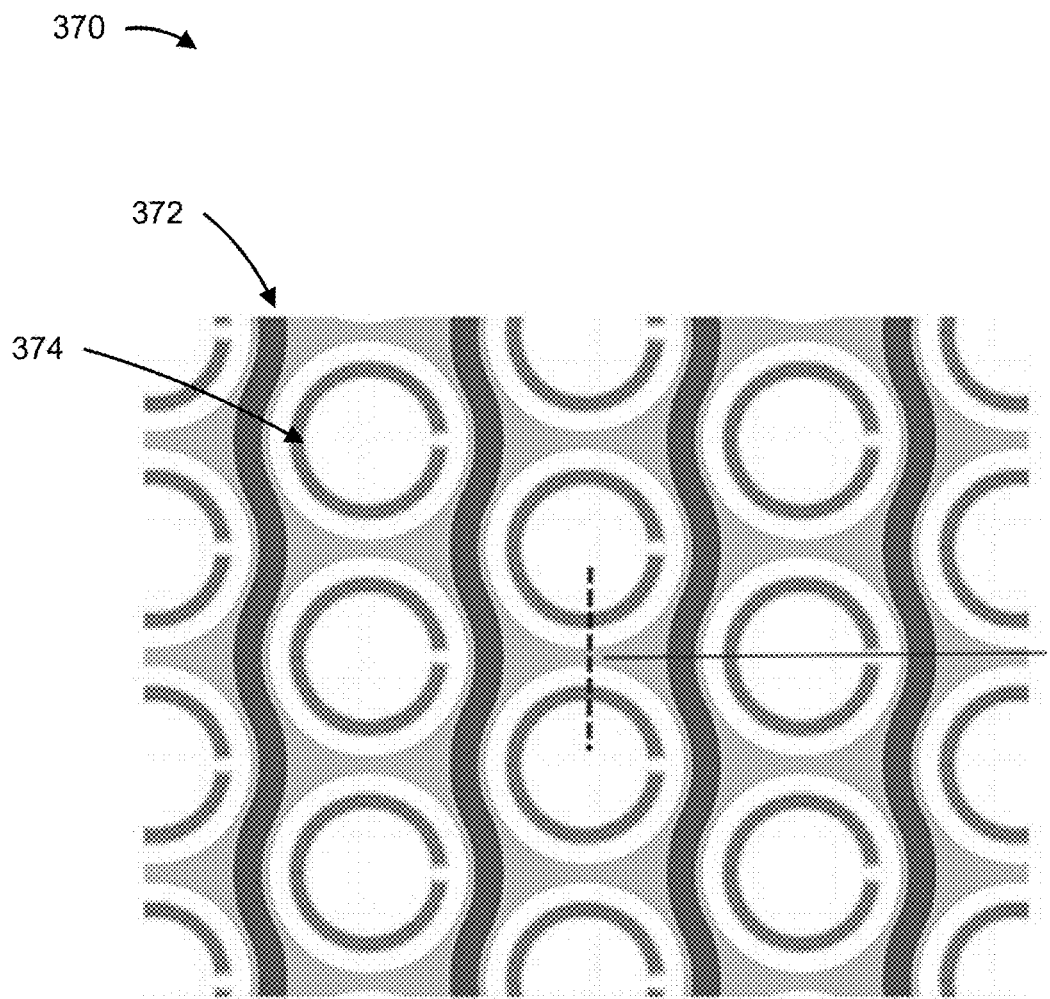

As shown in FIGS. 3A and 3B, matrix addressable VCSEL array 300 may include an emitter 310 with a ring or mesa type configuration. As shown in FIG. 3B, in cross-section, matrix addressable VCSEL array 300 may include a PPLT layer 350, an NPLT layer 352, a p-ohmic metal layer 354, a quantum well layer 356 (e.g., a single junction with multiple quantum wells), an implantation layer 358, an n+ contact layer 360, a blocking layer 362 (e.g., a $(p/n)^x$ blocking layer), and a substrate base layer 364 (e.g., an n+ GaAs substrate). As further shown in FIGS. 3A and 3B and in contrast to FIGS. 2A-2C, rather than a cathode on a bottom surface and sidewalls of an isolation trench, an anode may be disposed on the bottom surface and sidewalls of an isolation trench. In this case, using sidewalls for the anode may increase an effective width of the anodes for current flow, thereby reducing anode trace resistance relative to a planar anode trace. Reducing anode trace resistance enables a reduction in emitter pitch, chip size, and power consumption. In some implementations, as shown in FIG. 3C, and by VCSEL array 370, rather than a uniform mesa, vertical etching 372 may be added to the mesa forming a serpentine curved n-metal layer. This may enable a denser emitter arrangement of emitters 374 relative to emitters 310 of FIGS. 3A and 3B, by having serpentine-type n-epi etching trenches and small trenches that are connected together to form a mesa-type structure.

Figure 3D:
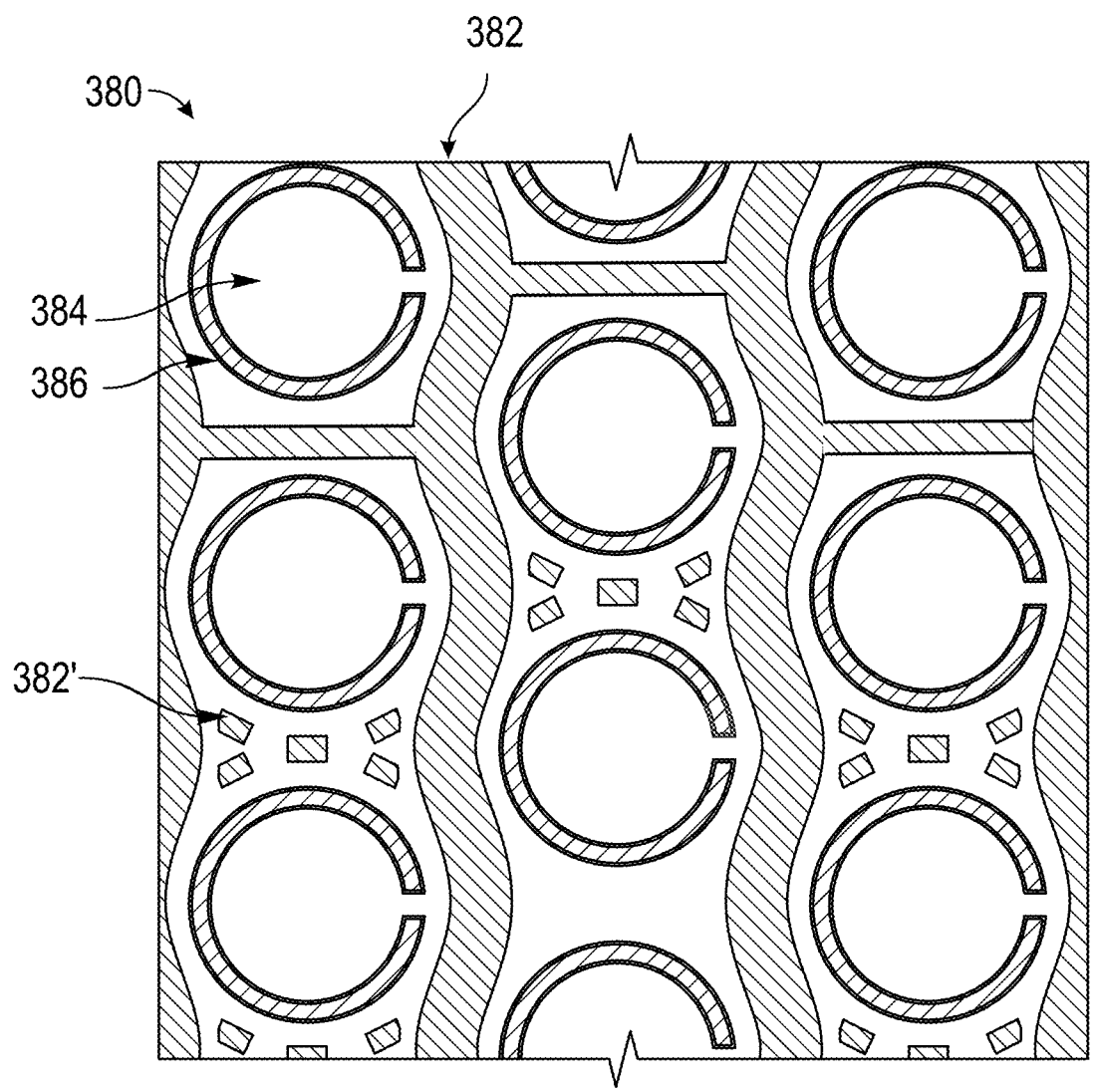

FIG. 3D is a diagram of a portion of a matrix addressable VCSEL array 380. Smaller trenches 382, similar to in FIG. 2A, are used around the emitters 384 with p-metallization 386 within each sub-array and at the transitions between different anodes, a narrow horizontal trench 382' runs between the serpentine trenches 382 to improve isolation between anodes. The horizontal trenches 382' may also be rounded and fan out as in FIG. 2A.

Figure 3E:
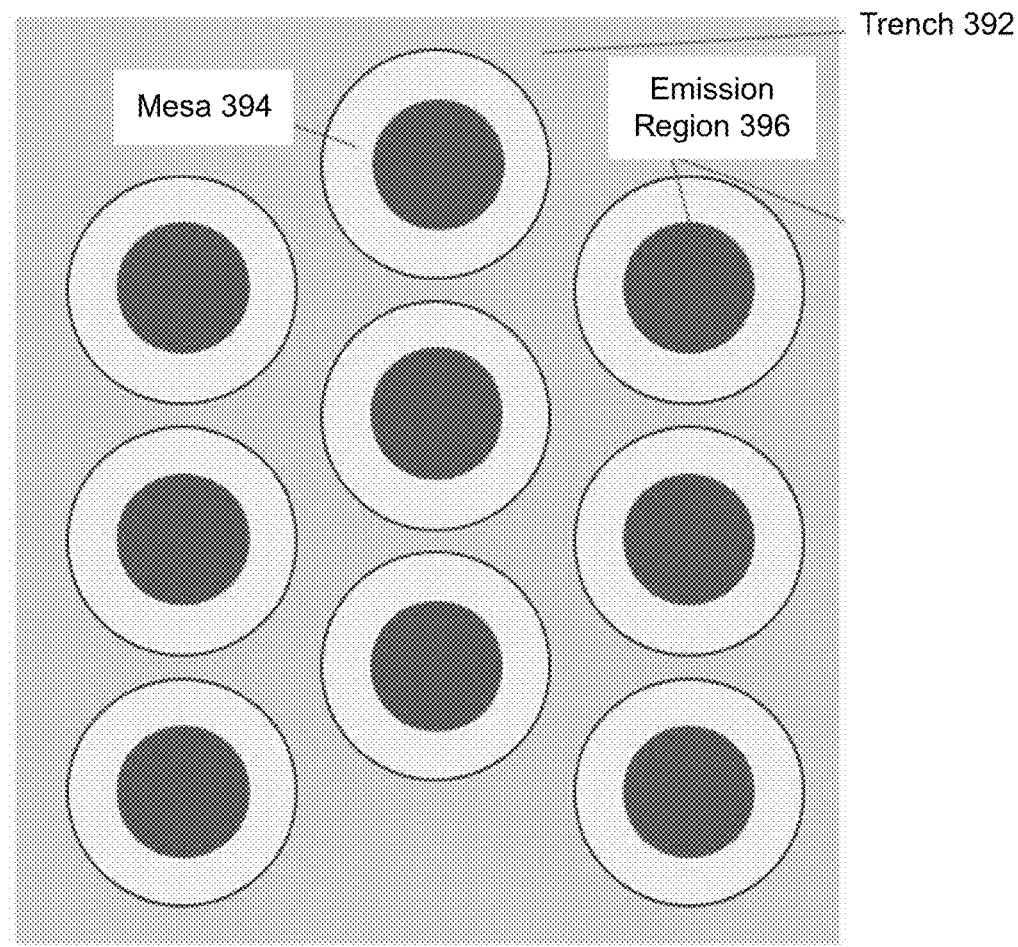
Figure 3F:
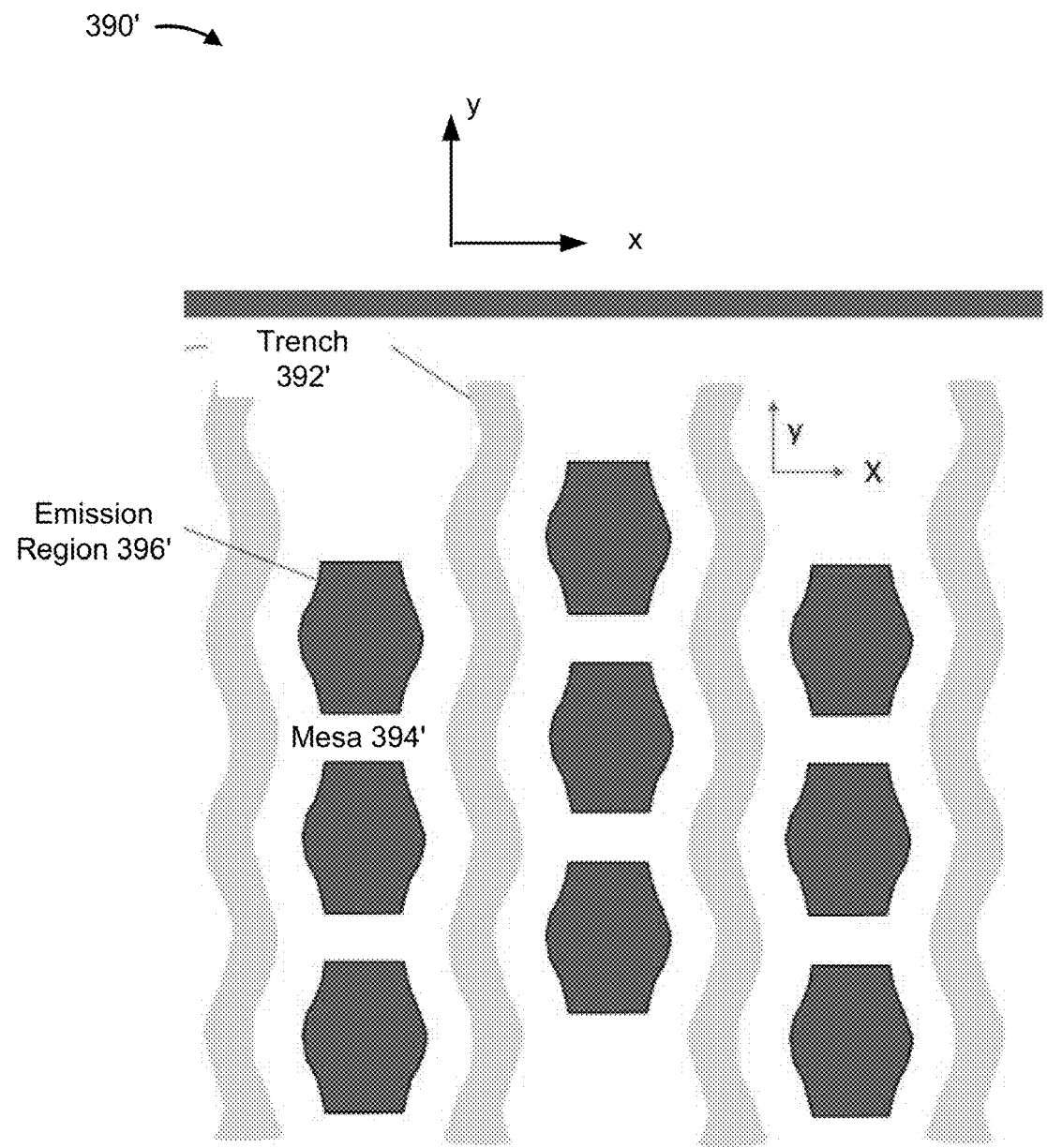

FIGS. 3E and 3F show VCSEL arrays 390 and 390', respectively. In FIG. 3E, a trench 392 surrounds mesas 394. Within each mesa 394, lateral oxidation forms a perimeter around an emission region 396. In contrast, in FIG. 3F, the trenches 392' are separate serpentine shapes and the mesas 394' form a continuous stripe with corrugated edges, rather than the cylindrically shaped mesa 394 in FIG. 3E. The emission areas 396 on mesa 394 in FIG. 3E may be formed by a lateral oxidation proceeding inwards (e.g., horizontally along an x-axis) from the trenches 392 and implant isolation which may be used to confine the mode vertically along a y-axis. With the example geometry shown in FIG. 3F, the emission regions 396' are brought closer along the y-axis. Additionally, the area of each emission region 396' may be larger than emission regions 396 in FIG. 3F. Increased area of the emission regions 396' reduces a quantity of columns of emitters used for the same active area, thereby reducing a chip size along the x-axis. The resulting reduction in sub-array size may be as large as approximately 30%, in this example.

As indicated above, FIGS. 3A-3F are provided as an example. Other examples may differ from what is described with regard to FIGS. 3A-3F.

Figure 4:
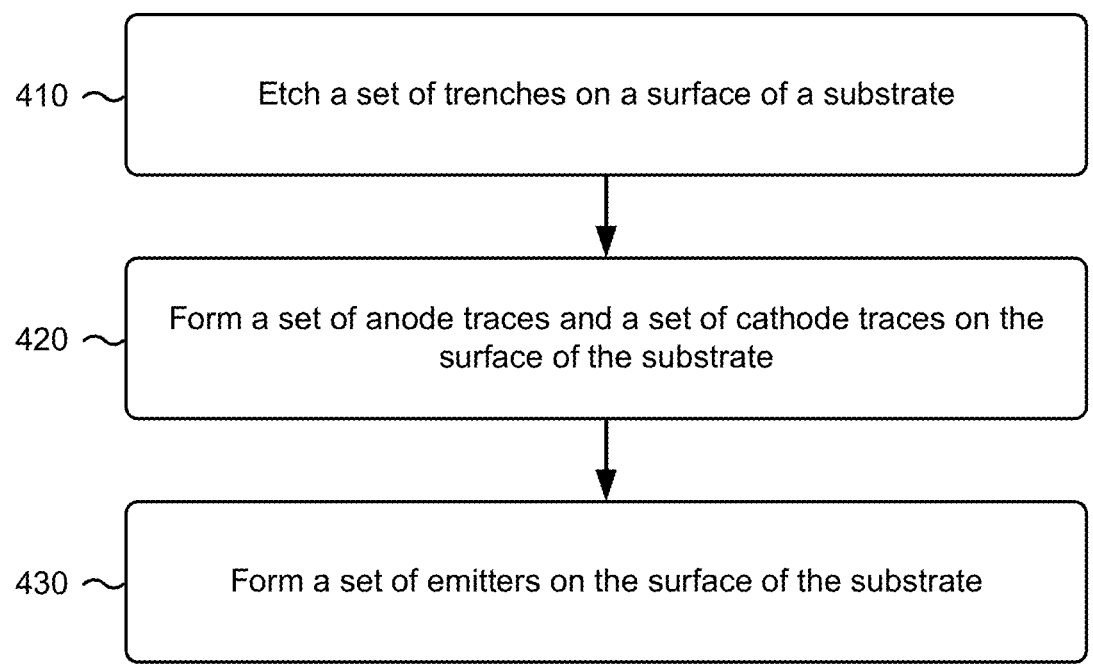
FIG. 4 is a flowchart of an example processes relating to manufacturing a matrix addressable VCSEL array, as described herein.

FIG. 4 is a flowchart of an example process 400 associated with manufacturing a matrix addressable VCSEL array. In some implementations, one or more process blocks of FIG. 4 may be performed by a device (e.g., a manufacturing device, such as an etching device, a deposition device, an attachment device, an epoxying device, a masking device, or a liftoff device, among other examples).

As shown in FIG. 4, process 400 may include etching a set of trenches on a surface of a substrate (block 410). For example, the device may etch a set of trenches on a surface of a substrate, as described above. In some implementations, the set of trenches includes one or more oxidation trenches and one or more n-metallization trenches.

As further shown in FIG. 4, process 400 may include forming a set of anode traces and a set of cathode traces on the surface of the substrate (block 420). For example, the device may form a set of anode traces and a set of cathode traces on the surface of the substrate, as described above. In some implementations, at least one anode trace, of the set of anode traces, or cathode trace, of the set of cathode traces, covers at least a portion of at least one trench of the set of trenches. In some implementations, the at least one anode trace or cathode trace is associated with a serpentine shape.

As further shown in FIG. 4, process 400 may include forming a set of emitters on the surface of the substrate (block 430). For example, the device may form a set of emitters on the surface of the substrate, as described above. In some implementations, the set of emitters, the set of anode traces, and the set of cathode traces form a matrix addressable VCSEL array.

Process 400 may include additional implementations, such as any single implementation or any combination of implementations described below and/or in connection with one or more other processes described elsewhere herein.

In a first implementation, process 400 includes forming an ion implantation layer or region using the set of cathode traces as an at least partial mask for forming the ion implantation layer or region. In some implementations, the ion implantation layer may be disposed between an emission area of an emitter and a sidewall of an isolation trench.

In a second implementation, alone or in combination with the first implementation, forming the set of emitters comprises forming the set of emitters in a hexagonal close pack grid arrangement.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

Figure 5:
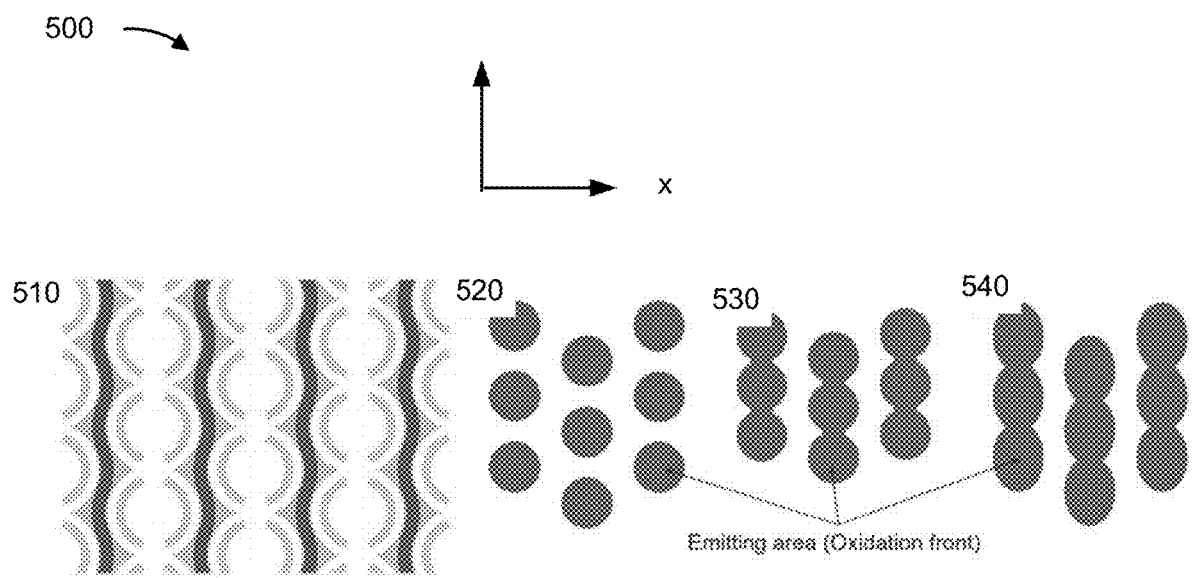
FIG. 5 is a diagram of emitter arrangements, as described herein.

FIG. 5 is a diagram 500 of emitter arrangements 510-540. As shown in FIG. 5, and by arrangement 510, a first emitter arrangement for a matrix addressable VCSEL array may include a ring or mesa type arrangement to increase a density of emitters. The first emitter arrangement includes serpentine anodes and cathodes, thereby achieving a pitch reduction from 54 μm in another arrangement described herein to 46 μm in the first arrangement. As shown by arrangement 520, a second emitter arrangement shows discrete emitting areas (e.g., oxidation fronts) for a matrix addressable VCSEL array. In contrast, as shown by arrangement 530, a third emitter arrangement may use a reduced emitter pitch in a vertical direction (e.g., along a y-axis) to increase emitter density relative to the second emitter arrangement. Similarly, as shown by arrangement 540, a fourth emitter arrangement may use oval shaped (e.g., or hourglass shaped) emitting areas to increase output power, thereby enabling a reduced quantity of emitter columns (e.g., horizontally along the x-axis) relative to the second emitter arrangement to achieve the same total output power. In this way, the third and fourth emitter arrangements enable increased output power using the same chip size or reduced chip size to achieve the same output power relative to the first emitter arrangement.

As indicated above, FIG. 5 is provided as an example. Other examples may differ from what is described with regard to FIG. 5.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A vertical cavity surface emitting laser (VCSEL) array, comprising:
   a substrate;
   a set of emitters disposed in a grid arrangement;
   a set of cathodes disposed on the substrate in a first direction, wherein a cathode, of the set of cathodes, is defined by a serpentine shape,
      wherein the cathode is disposed between a first column and a second column of the set of cathodes in the grid arrangement, in the first direction, and
      wherein the serpentine shape of the cathode is defined by curves configured around a subset of the set of emitters that are in the first column and the second column; and
   a set of anodes disposed on the substrate in a second direction, wherein an anode, of the set of anodes, is defined by the serpentine shape.

2. The VCSEL array of claim 1,
   wherein the grid arrangement comprises a first subset of the set of emitters that is offset from a second subset of the set of emitters with respect to the first direction.

3. The VCSEL array of claim 2, wherein the grid arrangement is a hexagonal close pack grid arrangement.

4. The VCSEL array of claim 2, wherein the emitter comprises a P-ohmic metal region, a trench etch region, and a via opening that connects the p-ohmic metal region with a plating metal layer of the substrate.

5. The VCSEL array of claim 4, wherein the p-ohmic metal region forms a ring shape, with the via opening forming a toothed shape around the ring shape.

6. The VCSEL array of claim 1, further comprising:
   a set of isolation trenches disposed on the substrate in the first direction, wherein an isolation trench, of the set of isolation trenches, is defined by the serpentine shape and is parallel to the cathode.

7. The VCSEL array of claim 6, wherein a plurality of cathodes, of the set of cathodes, is disposed between a pair of isolation trenches of the set of isolation trenches.

8. The VCSEL array of claim 1, wherein the set of cathodes and the set of anodes form a set of matrix addressable subarrays of the VCSEL array, and
   wherein each matrix addressable subarray comprises one or more emitters.

9. A vertical cavity surface emitting laser (VCSEL) array, comprising:
   a substrate;
   a set of cathodes disposed on the substrate in a first direction,
      wherein a cathode of the set of cathodes is defined by a serpentine shape;
   a set of anodes disposed on the substrate in a second direction; and
   a set of emitters disposed on the substrate in a grid arrangement,
      wherein the cathode is disposed between a first column and a second column of the set of cathodes in the grid arrangement, in the first direction,
      wherein the serpentine shape of the cathode is defined by curves configured around a subset of the set of emitters that are in the first column and the second column, and
      wherein an emitter, of the set of emitters, is associated with a set of first trenches and a set of second trenches,
         wherein the set of first trenches comprises a set of n-epi etching trenches that etch an n-contact layer of the substrate, and
         wherein the set of second trenches comprises a set of small trenches that, with the set of first trenches, forms an oxidation aperture for the emitter.

10. The VCSEL array of claim 9, wherein the emitter comprises a ring shaped via surrounded by a p-ohmic metal region that connects a p-metal layer to a plating metal layer.

11. The VCSEL array of claim 9, wherein a trench, of the set of first trenches, comprises a serpentine shape in the first direction.

12. The VCSEL array of claim 9, wherein the set of first trenches is associated with a first etching depth and etching target and the set of second trenches is associated with a second etching depth and etching target.

13. The VCSEL array of claim 9, wherein the set of first trenches and the set of second trenches have etching profiles in the same direction.

14. The VCSEL array of claim 9, wherein one or more emitters, of the set of emitters, have an oval shape or an hourglass shape.

15. The VCSEL array of claim 9, wherein a first emitter, of the set of emitters, is at least partially confined by the second set of trenches and a second emitter, of the set of emitters, is at least partially confined by ion implantation.

16. A vertical cavity surface emitting laser (VCSEL) array, comprising:
   a substrate;
   a set of cathodes disposed on the substrate in a first direction, wherein a cathode, of the set of cathodes, is defined by a serpentine shape;
   a set of anodes disposed on the substrate in a second direction, wherein an anode, of the set of anodes, is defined by the serpentine shape; and
   a set of emitters disposed on the substrate in a hexagonal grid arrangement,
      wherein the cathode is disposed between a first column and a second column of the set of cathodes in the grid arrangement, in the first direction,
      wherein the serpentine shape of the cathode is defined by curves configured around a subset of the set of emitters that are in the first column and the second column, and
      wherein an emitter, of the set of emitters, is associated with a set of first trenches and a set of second trenches,
         wherein the set of first trenches comprises a set of n-epi etching trenches that etch an n-contact layer of the substrate, and
         wherein the set of second trenches comprises a set of small trenches that, with the set of first trenches, forms an oxidation aperture for the emitter.

17. The VCSEL array of claim 16, wherein the cathode is disposed over a surface of an n-epi etching trench of the set of n-epi etching trenches,
   the surface comprising a base of the n-epi etching trench and a set of sidewalls of the n-epi etching trench.

18. The VCSEL array of claim 17, further comprising:
   an ion implantation region disposed between an emission area of the emitter and a sidewall of the set of sidewalls.

19. The VCSEL array of claim 18, wherein the cathode forms at least a partial mask for the ion implantation region.

20. The VCSEL array of claim 16, wherein the anode is disposed over a surface of a horizontal connecting trench of the substrate, the surface comprising a base of the horizontal connecting trench and a set of sidewalls of the horizontal connecting trench.

\* \* \* \* \*